US012682800B2

(12) United States Patent
Aizawa et al.

(10) Patent No.: US 12,682,800 B2
(45) Date of Patent: Jul. 14, 2026

(54) OUTPUT AMPLIFIER CIRCUIT, DISPLAY DRIVER AND DISPLAY DEVICE

(71) Applicant: LAPIS Technology Co., Ltd., Yokohama (JP)

(72) Inventors: Hiroki Aizawa, Yokohama (JP); Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 18/893,996

(22) Filed: Sep. 24, 2024

(65) Prior Publication Data

US 2025/0111812 A1    Apr. 3, 2025

(30) Foreign Application Priority Data

Sep. 28, 2023    (JP) ................................. 2023-167869

(51) Int. Cl.
G09G 3/20        (2006.01)
H03F 3/16        (2006.01)
(52) U.S. Cl.
CPC ................. G09G 3/20 (2013.01); H03F 3/16 (2013.01); *G09G 2310/0291* (2013.01); *G09G 2310/08* (2013.01); *G09G 2320/0233* (2013.01); *G09G 2330/028* (2013.01)
(58) Field of Classification Search
CPC ... G09G 2310/0291; G09G 2300/0426; G09G 2330/028; G09G 2300/0809
See application file for complete search history.

(56) References Cited

U.S. PATENT DOCUMENTS

| | | | | |
|---|---|---|---|---|
| 2015/0049073 A1* | 2/2015 | Morita | ................. | G09G 3/3688 |
| | | | | 345/211 |
| 2015/0255035 A1* | 9/2015 | Takahashi | ............ | G09G 3/3688 |
| | | | | 345/51 |
| 2017/0179160 A1* | 6/2017 | Takahashi | .............. | H10D 86/60 |
| 2017/0358277 A1* | 12/2017 | Yamazaki | ............ | G09G 3/3688 |
| 2019/0156756 A1* | 5/2019 | Aizawa | ................ | G09G 3/3258 |

FOREIGN PATENT DOCUMENTS

JP        2019095545        6/2019

* cited by examiner

*Primary Examiner* — Van N Chow
(74) *Attorney, Agent, or Firm* — JCIPRNET

(57) ABSTRACT

An output amplifier circuit, and a display driver and a display device including the output amplifier circuit.
The output amplifier circuit includes: first to nth amplifiers which receive first to nth input voltages and generate first to nth output voltages by amplifying the respective first to nth input voltages; first to Kth bias circuits which are provided corresponding to each of first to Kth amplifier groups formed by grouping the first to nth amplifiers into K groups, and each generates a bias voltage for setting a current value of an operating current of the amplifiers; first to Kth wirings which supply the bias voltage generated by each of the first to Kth bias circuits to the first to Kth amplifier groups respectively; and a switch circuit which, when in an ON state, connects one wiring among the first to Kth wirings with another wiring different from the one wiring.

9 Claims, 7 Drawing Sheets

OUTPUT AMPLIFIER CIRCUIT, DISPLAY DRIVER AND DISPLAY DEVICE

CROSS-REFERENCE TO RELATED APPLICATION

This application claims the priority benefits of Japanese application no. 2023-167869, filed on Sep. 28, 2023. The entirety of the above-mentioned patent application is hereby incorporated by reference herein and made a part of this specification.

BACKGROUND

Technical Field

The disclosure relates to an output amplifier circuit including multiple amplifiers, a display driver and a display device including the output amplifier circuit.

Description of Related Art

A display driver which drives a display panel, such as a liquid crystal display panel or an organic EL panel, includes multiple output amplifiers that amplify gradation voltages corresponding to brightness levels represented by video signals and supply the gradation voltages to source lines of the display panel.

Furthermore, with the recent trend towards larger screens and higher resolutions in display panels, there is a demand for output amplifiers to have shorter rise or fall times of output voltages, in other words, higher slew rates. Incidentally, output amplifiers, which are, for example, composed of operational amplifiers, can achieve higher slew rates by increasing the operating current flowing through differential stages thereof, but this leads to increased power consumption.

Therefore, it is conceivable to control the magnitude of the operating current flowing through the differential stage of the output amplifier from outside the output amplifier using a bias voltage, such that the operating current is large in the first half of one data period and small in the latter half. For example, a bias circuit for generating a bias voltage is provided in the central unit of a semiconductor IC chip serving as a display driver, and the bias voltage is supplied to each of the output amplifiers disposed along the long side direction of the semiconductor IC chip via a bias line from the bias circuit.

However, due to the resistance of the bias line and the large impedance caused by the gate capacitance of a transistor included in each of the output amplifiers, display unevenness might be caused due to the occurrence of a significant difference in the timing at which the bias voltage is changed between the central unit of the chip and the end unit of the chip.

Therefore, as a method to reduce the timing difference in a bias voltage change between the central unit of the chip and the end unit of the chip, a display driver was proposed that grouped the output amplifiers and provided a sub-bias circuit for generating a bias voltage for each of groups (refer to, for example, Patent Literature 1 (Japanese Patent Application Laid-Open No. 2019-95545)).

The display driver disclosed in Patent Literature 1 groups the output amplifiers and provides a sub-bias circuit for generating a bias voltage for each of groups.

Incidentally, in the display driver disclosed in Patent Literature 1, when variations occurred in the bias voltages generated by each of sub-bias circuits due to manufacturing variations and other factors, this could lead to characteristic variations among output amplifiers between groups, potentially causing display unevenness.

Therefore, the disclosure provides an output amplifier circuit capable of suppressing display unevenness, and a display driver and a display device including the output amplifier circuit.

SUMMARY

The output amplifier circuit according to the disclosure includes: first to nth amplifiers which receive first to nth (where n is an integer of 2 or more) input voltages for each of data periods of a predetermined cycle and generate first to nth output voltages by amplifying the respective first to nth input voltages; first to Kth bias circuits which are provided corresponding to each of first to Kth amplifier groups formed by grouping the first to nth amplifiers into K (where K is an integer of 2 or more) groups, and each generates a bias voltage for setting a current value of an operating current of the amplifiers; first to Kth wirings which are independent of one another and supply the bias voltage generated by each of the first to Kth bias circuits to the first to Kth amplifier groups respectively; and a switch circuit which, when in an ON state, connects one wiring among the first to Kth wirings with another wiring different from the one wiring.

The display driver according to the disclosure includes: a gradation voltage generation circuit which generates first to nth (where n is an integer of 2 or more) gradation voltages each having a voltage value corresponding to a brightness level of each of pixels based on a video signal; first to nth amplifiers which receive the first to nth gradation voltages and supply first to nth output voltages by amplifying the respective first to nth gradation voltages to first to nth data lines of a display panel; first to Kth bias circuits which are provided corresponding to each of first to Kth amplifier groups formed by grouping the first to nth amplifiers into K (where K is an integer of 2 or more) groups, and generates a bias voltage for setting a current value of an operating current of the amplifiers; first to Kth wirings which are independent of one another and supply the bias voltage generated by each of the first to Kth bias circuits to the first to Kth amplifier groups respectively; and a switch circuit which, when in an ON state, connects one wiring among the first to Kth wirings with another wiring different from the one wiring.

The display device according to the disclosure includes: a display panel which includes first to nth (where n is an integer of 2 or more) data lines extending along a horizontal direction of a display screen; a gradation voltage generation circuit which generates first to nth gradation voltages each having a voltage value corresponding to a brightness level of each of pixels based on a video signal; first to nth amplifiers which receive the first to nth gradation voltages and supply first to nth output voltages by amplifying the respective first to nth gradation voltages to the first to nth data lines of the display panel; first to Kth bias circuits which are provided corresponding to each of first to Kth amplifier groups formed by grouping the first to nth amplifiers into K (where K is an integer of 2 or more) groups, and each generates a bias voltage for setting a current value of an operating current of the amplifiers; first to Kth wirings which are independent of one another and supply the bias voltage generated by each of the first to Kth bias circuits to the first to Kth amplifier groups respectively; and a switch circuit which, when in an ON state, connects one wiring among the first to Kth wirings with another wiring different from the one wiring.

DETAILED DESCRIPTION

In the disclosure, the first to Kth bias circuits each generating the bias voltage for setting the current value of the operating current of the amplifiers are provided corresponding to each of the first to Kth amplifier groups, which are formed by grouping the first to nth amplifiers into K groups. The first to nth amplifiers receive the first to nth input voltages for each of the data periods of a predetermined cycle and generate the first to nth output voltages by amplifying the respective first to nth input voltages. Furthermore, in supplying the bias voltage generated by each of the first to Kth bias circuits to the first to Kth amplifier groups respectively via the first to Kth wirings, a switch circuit which connects one wiring among the first to Kth wirings with another wiring different from the one wiring is provided.

Thus, even if variations occur in the bias voltage generated by each of the first to Kth bias circuits, the difference in the voltage values between the bias voltages generated by each of the bias circuit disappears immediately before the end of each of the data periods, so that display unevenness within the display screen is reduced.

Hereinafter, examples of the disclosure are described in detail with reference to the drawings.

Example 1

Figure 1:
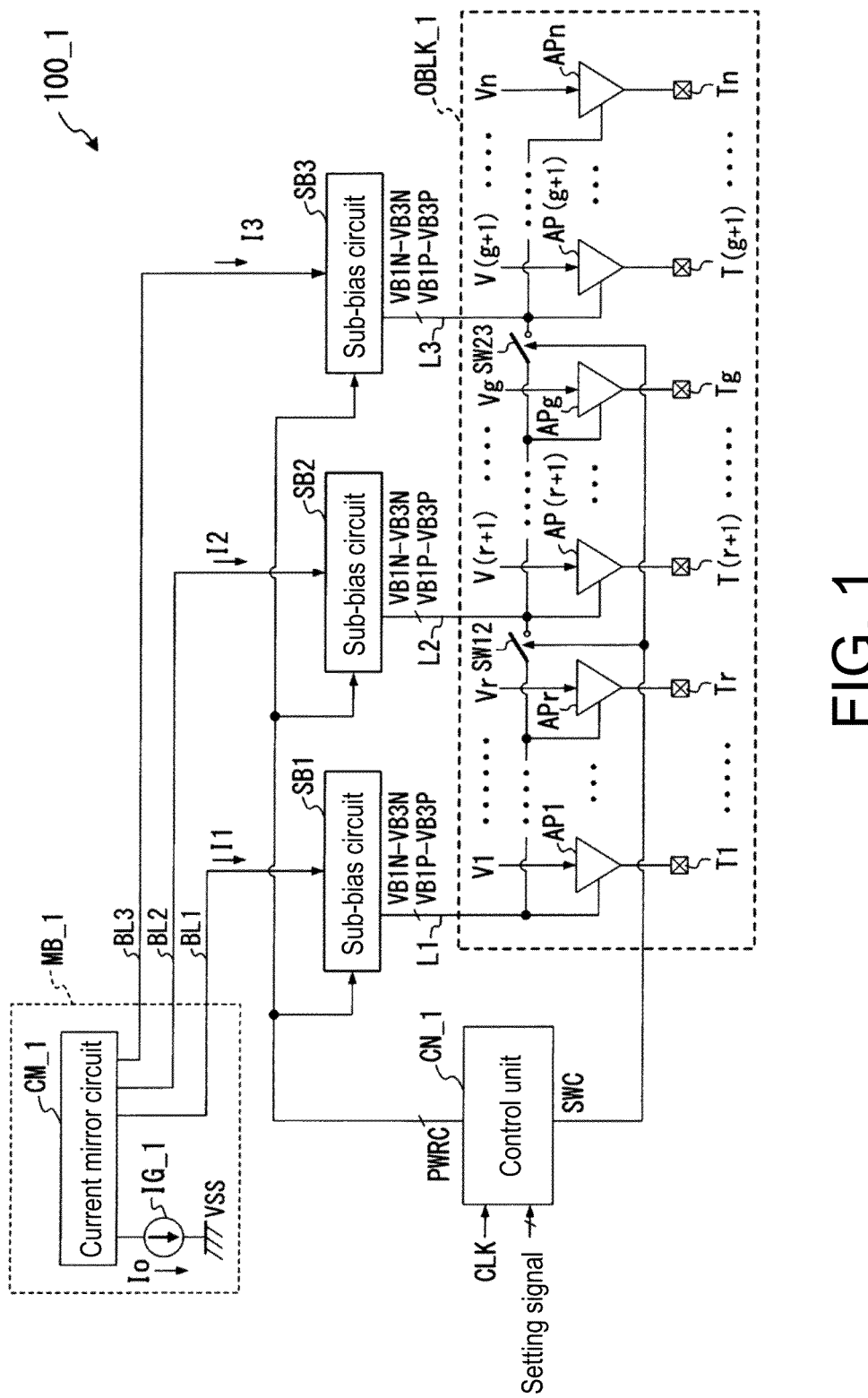
FIG. 1 is a block diagram showing the configuration of an output amplifier circuit 100_1 as a first example of an output amplifier circuit according to the disclosure.

FIG. 1 is a block diagram showing the configuration of an output amplifier circuit 100_1 as a first example of an output amplifier circuit according to the disclosure.

The output amplifier circuit 100_1 is provided, for example, in a display driver that drives a display panel, receives n (where n is an integer of 2 or more) input voltages V1 to Vn as gradation voltages corresponding to brightness levels represented by video signals, amplifies the respective input voltages, and outputs the respective input voltages to the display panel as output voltages G1 to Gn for driving the display panel.

The output amplifier circuit 100_1 is formed on a semiconductor IC chip and includes a main bias circuit MB_1, sub-bias circuits SB1 to SB3, a control unit CN_1, and an output amplifier unit OBLK_1.

The main bias circuit MB_1 includes a current mirror circuit CM_1 and a reference current source IG_1.

The reference current source IG_1 generates a reference current Io with a predetermined constant current value.

The current mirror circuit CM_1 generates three systems of bias control currents I1 to I3, each of which is a copy of the reference current Io. The current mirror circuit CM_1 supplies the bias control current I1 to the sub-bias circuit SB1 via a wiring BL1, supplies the bias control current I2 to the sub-bias circuit SB2 via a wiring BL2, and supplies the bias control current I3 to the sub-bias circuit SB3 via a wiring BL3.

The control unit CN_1 receives a clock signal CLK as a clock signal with a predetermined cycle, and at the timing of the clock signal CLK, supplies a bias control signal PWRC that specifies the voltage value of the bias voltage to the sub-bias circuits SB1 to SB3. Furthermore, the control unit CN_1 supplies a switch control signal SWC that sets the switch to an ON state or an OFF state to the output amplifier unit OBLK_1.

The output amplifier unit OBLK_1 includes amplifiers AP1 to APn and switch circuits SW12 and SW23.

The amplifiers AP1 to APn receive the input voltages V1 to Vn for each of data periods of a predetermined cycle that is delimited by the rising edge (or falling edge) of the clock signal CLK. Then, the amplifiers AP1 to APn individually amplify each of the input voltages V1 to Vn to generate n voltages as the output voltages G1 to Gn, and output the voltages via output terminals T1 to Tn of the semiconductor IC chip. Each of the amplifiers AP1 to APn consists of, for example, an operational amplifier with the same configuration. Further, the data period of the predetermined cycle may be set to, for example, such that the start timing of the data period is shifted little by little for each of a predetermined number of the amplifiers AP1 to APn in order to suppress the noise impact due to simultaneous operation of the amplifiers AP1 to APn.

The operating current flowing through the differential stages and current mirror stages of the amplifiers AP1 to APn is set by bias voltages VB1N to VB3N and VB1P to VB3P supplied from the sub-bias circuits SB1 to SB3. Thus, each of the amplifiers AP1 to APn adjusts an output slew rate thereof based on the aforementioned bias voltage groups (VB1N to VB3N and VB1P to VB3P).

Further, the amplifiers AP1 to APn are grouped into a first group to which the amplifiers AP1 to APr (where r is an integer less than n) belong, a second group to which the amplifiers AP(r+1) to APg (where g is an integer greater than r and less than n) belong, and a third group to which the amplifiers AP(g+1) to APn belong.

At this time, the amplifiers AP1 to APr belonging to the first group receive the bias voltages VB1N to VB3N and VB1P to VB3P generated by the sub-bias circuit SB1 via a first wiring group L1 consisting of 6 wirings. The amplifiers AP(r+1) to APg belonging to the second group receive the bias voltages VB1N to VB3N and VB1P to VB3P generated by the sub-bias circuit SB2 via a second wiring group L2 consisting of 6 wirings. The amplifiers AP(g+1) to APn belonging to the third group receive the bias voltages VB1N to VB3N and VB1P to VB3P generated by the sub-bias circuit SB3 via a third wiring group L3 consisting of 6 wirings.

The switch circuit SW12 consists of six switch elements that, when in the ON state, electrically connect the first wiring group L1 and the second wiring group L2 so that the wiring groups supply the same bias voltage, and, when in the OFF state, disconnect the connection between the first wiring group L1 and the second wiring group L2.

The switch circuit SW23 consists of six switch elements that, when in the ON state, electrically connect the second wiring group L2 and the third wiring group L3 so that the wiring groups supply the same bias voltage, and, when in the OFF state, cut off the connection between the second wiring group L2 and the third wiring group L3.

The switch circuits SW12 and SW23 are set to the aforementioned ON state or OFF state in response to the switch control signal SWC supplied from the control unit CN_1.

Each of the sub-bias circuits SB1 to SB3 possesses the same internal configuration, and is provided corresponding to each of the first to third groups into which the amplifiers AP1 to APn are divided as described above.

The sub-bias circuit SB1 receives the bias control current I1 transmitted from the main bias circuit MB_1 via the wiring BL1. The sub-bias circuit SB1 generates the bias voltages VB1N to VB3N and VB1P to VB3P having voltage values corresponding to the current value of the bias control current I1, and supplies the aforementioned bias voltages to the respective amplifiers AP1 to APr belonging to the first group via the first wiring group L1.

The sub-bias circuit SB2 receives the bias control current I2 transmitted from the main bias circuit MB_1 via the wiring BL2. The sub-bias circuit SB2 generates the bias voltages VB1N to VB3N and VB1P to VB3P having voltage values corresponding to the current value of the bias control current I2, and supplies the aforementioned bias voltages to the respective amplifiers AP(r+1) to APg belonging to the second group via the second wiring group L2.

The sub-bias circuit SB3 receives the bias control current I3 transmitted from the main bias circuit MB_1 via the wiring BL3. The sub-bias circuit SB3 generates the bias voltages VB1N to VB3N and VB1P to VB3P having voltage values corresponding to the current value of the bias control current I3, and supplies the aforementioned bias voltages to the respective amplifiers AP(g+1) to APn belonging to the third group via the third wiring group L3.

In addition, the sub-bias circuits SB1 to SB3 include a function to adjust the voltage values of the bias voltages (VB1N to VB3N and VB1P to VB3P) in response to the bias control signal PWRC.

The following describes the detailed configurations of the amplifiers AP1 to APn and the sub-bias circuits SB1 to SB3 shown in FIG. 1.

Figure 2:
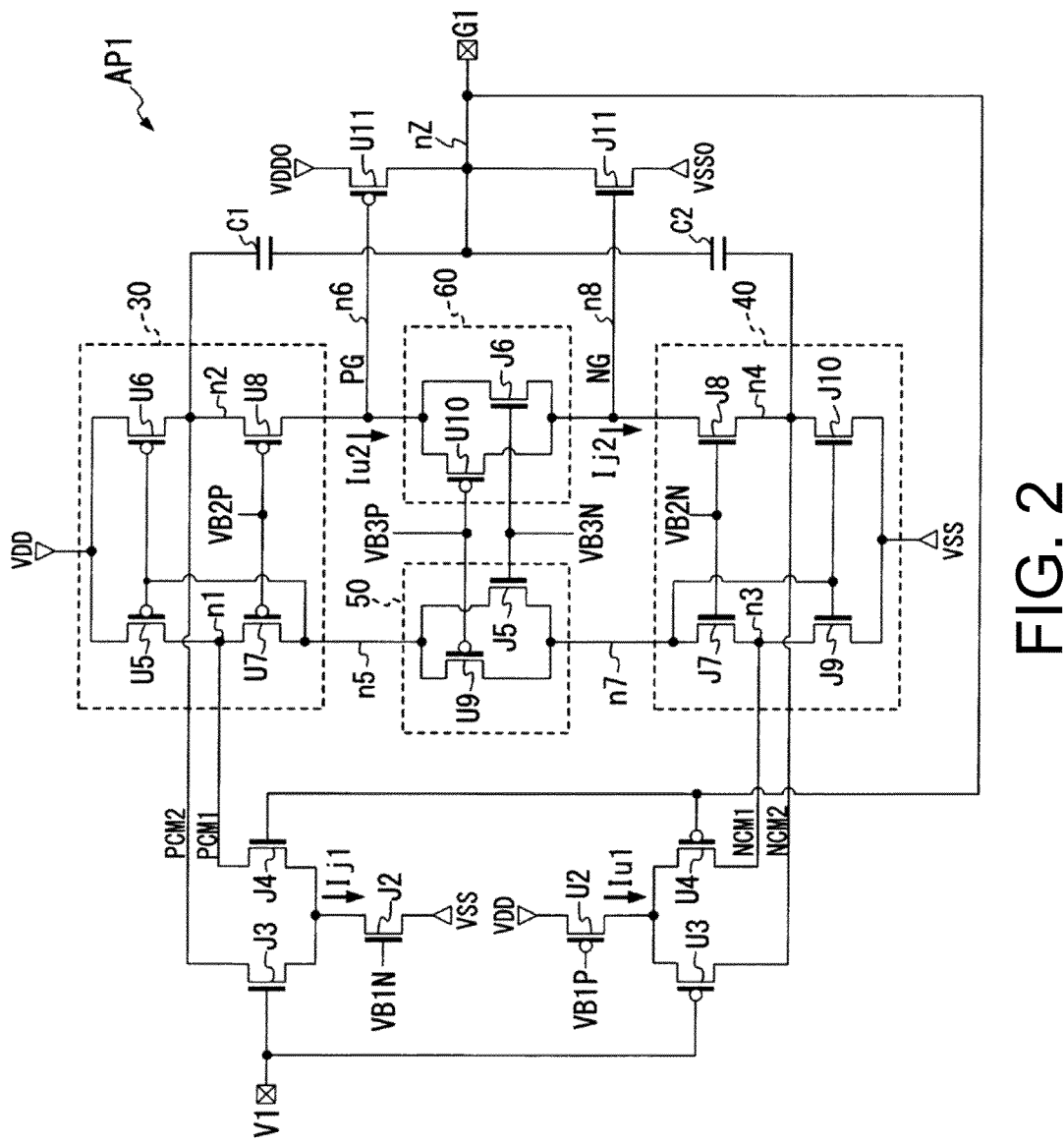
FIG. 2 is a circuit diagram showing the internal configuration of the amplifier AP1, which is extracted from among the amplifiers AP1 to APn.

FIG. 2 is a circuit diagram showing the internal configuration of the amplifier AP1, which is extracted from among the amplifiers AP1 to APn.

The amplifier AP1 includes a differential stage containing P-channel type transistors U2 to U4 and N-channel type transistors J2 to J4, an output stage containing a P-channel type transistor U11 and an N-channel type transistor J11, cascode current mirror circuits 30 and 40, and floating current sources 50 and 60.

A power supply voltage VDD is applied to the source of the transistor U2 in the differential stage, and a bias voltage VB1P is supplied to the gate of the transistor U2. The transistor U2 generates an operating current Iu1 with a current value corresponding to the bias voltage VB1P, and supplies the operating current Iu1 to the sources of the transistors U3 and U4 respectively. The transistor U3 receives an input voltage V1 at the gate thereof. The transistor U4 receives an output voltage G1, which is the output of the amplifier AP1, at the gate thereof. The transistors U3 and U4 generate currents NCM1 and NCM2 by dividing the operating current Iu1 supplied from the transistor U2 into two parts in accordance with the voltage ratio between the input voltage V1 and the output voltage G1. The transistors U3 and U4 supply the currents NCM1 and NCM2 to nodes n3 and n4 of the cascode current mirror circuit 40 via the respective drains thereof. That is, the transistor U3 supplies the current NCM2 corresponding to the voltage value of the input voltage V1 to the node n4 of the cascode current mirror circuit 40. The transistor U4 supplies current NCM1 corresponding to the voltage value of the output voltage G1 to the node n3 of the cascode current mirror circuit 40.

A ground voltage VSS is applied to the source of the transistor J2 in the differential stage, and a bias voltage VB1N is supplied to the gate. The drain of the transistor J2 is connected to the sources of the transistors J3 and J4 respectively. The transistor J2 generates an operating current Ij1 with a current value corresponding to the bias voltage VB1N, and draws the operating current Ij1 from the sources of the transistors J3 and J4. The transistor J3 receives the input voltage V1 at the gate thereof. The transistor J4 receives the output voltage G1 at the gate thereof. The transistors J3 and J4 generate currents PCM1 and PCM2 by dividing the operating current Ij1 into two parts in accordance with the voltage ratio between the input voltage V1 and the output voltage G1 received at the respective gates thereof. The transistor J3 draws the current PCM2 corresponding to the input voltage V1 from a node n2 of the cascode current mirror circuit 30 and supplies the current PCM2 to the drain of the transistor J2. The transistor J4 draws the current PCM1 corresponding to the output voltage G1 from a node n1 of the cascode current mirror circuit 30 and supplies the current PCM1 to the drain of transistor J2.

Further, in the aforementioned differential stage, the current value of the operating current Iu1 is adjusted by the bias voltage VB1P, and furthermore, the current value of the aforementioned operating current Ij1 is adjusted by the bias voltage VB1N. Thus, for example, the lower the voltage value of the bias voltage VB1P, the larger the current supplied to the nodes n3 and n4 of the cascode current mirror circuit 40. In addition, the higher the voltage value of the bias voltage VB1N, the larger the current drawn from the nodes n1 and n2 of the cascode current mirror circuit 30.

The cascode current mirror circuit 30 includes P-channel type transistors U5 to U8, and the cascode current mirror circuit 40 includes N-channel type transistors J7 to J10. In addition, the floating current source 50 includes a P-channel type transistor U9 and an N-channel type transistor J5, and the floating current source 60 includes a P-channel type transistor U10 and an N-channel type transistor J6.

A power supply voltage VDD is applied to the respective sources of the transistors U5 and U6 of the cascode current mirror circuit 30, and the respective gates of the transistors U5 and U6 are connected to each other. The drain of the transistor U5 is connected to the source of the transistor U7 via the node n1. The drain of the transistor U6 is connected to the source of the transistor U8 via the node n2. A bias voltage VB2P is applied to both the gates of the transistors U7 and U8. The drain of the transistor U7 is connected via a node n5 to the respective gates of the transistors U5 and U6, and the source of the transistor U9 and the drain of the transistor J5 in the floating current source 50.

The drain of transistor U8 is connected via a node n6, which serves as a drive node at a high potential side, to the source of the transistor U10 and the drain of the transistor J6 in the floating current source 60. A bias voltage VB3P is applied to the respective gates of the transistors U9 and U10, and a bias voltage VB3N is applied to the respective gates of the transistors J5 and J6. The drain of the transistor U9 and the source of the transistor J5 are connected via a node n7 to the drain of the transistor J7 in the cascode current mirror circuit 40. The drain of the transistor U10 and the source of the transistor J6 are connected via a node n8, which serves as a drive node at a low potential side, to the drain of the transistor J8 in the cascode current mirror circuit 40.

A bias voltage VB2N is applied to the respective gates of the transistors J7 and J8. The source of the transistor J7 is connected to the drain of the transistor J9 via the node n3. The source of the transistor J8 is connected to the drain of the transistor J10 via the node n4. A ground voltage VSS is applied to the respective sources of the transistors J9 and J10, and the respective gates of the transistors J9 and J10 are connected to the drain of the transistor J7.

In the aforementioned cascode current mirror circuits 30 and 40 and the floating current sources 50 and 60, an operating current Iu2 with a current value corresponding to the difference between the current PCM1 and the current PCM2 supplied from the differential stage flows into the node n6, and an operating current Ij2 with a current value corresponding to the difference between the current NCM1 and the current NCM2 supplied from the differential stage flows into the node n8.

Thus, in the cascode current mirror circuits 30 and 40 and the floating current sources 50 and 60, by supplying the operating current Iu2 corresponding to the difference between the current PCM1 and the current PCM2 to the node n6 or drawing the operating current Iu2 from the node n6, an output drive voltage PG at a high potential side is generated at the node n6. The output drive voltage PG is supplied to the gate of the transistor U11 in the output stage. In addition, in the cascode current mirror circuits 30 and 40 and the floating current sources 50 and 60, by supplying the operating current Ij2 corresponding to the difference between the current NCM1 and the current NCM2 to the node n8 or drawing the operating current Ij2 from the node n8, an output drive voltage NG at a low potential side is generated at the node n8. The output drive voltage NG is supplied to the gate of the transistor J11 in the output stage.

A power supply voltage VDD0 is applied to the source of the transistor U11 in the output stage, and a current corresponding to the output drive voltage PG received at the gate thereof is generated and supplied to an output node nZ, thereby increasing the voltage of the output node nZ. A ground voltage VSS0 is applied to the source of the transistor J11, and a current corresponding to the output drive voltage NG received at the gate thereof is drawn from the output node nZ, thereby decreasing the voltage of the output node nZ.

Through the operation of the aforementioned transistors U11 and J11, the output voltage G1 is generated at the output node nZ, and is output via an output terminal. At this time, the output voltage G1 that has been output is respectively fed back and supplied to the gate of the transistor U4 at a high potential side and the gate of the transistor J4 at a low potential side in the differential stage.

Incidentally, according to the configuration of the amplifier AP1 shown in FIG. 2, the current values of the operating currents Iu2 and Ij2 flowing to the nodes n6 and n8, which serve as drive nodes for driving the transistors U11 and J11 in the output stage, are adjusted in accordance with the magnitudes of the bias voltages VB1N to VB3N and VB1P to VB3P. Thus, the magnitude of the current sent to and drawn from the output node nZ changes, thereby adjusting the slew rate of the amplifier AP1.

Figure 3:
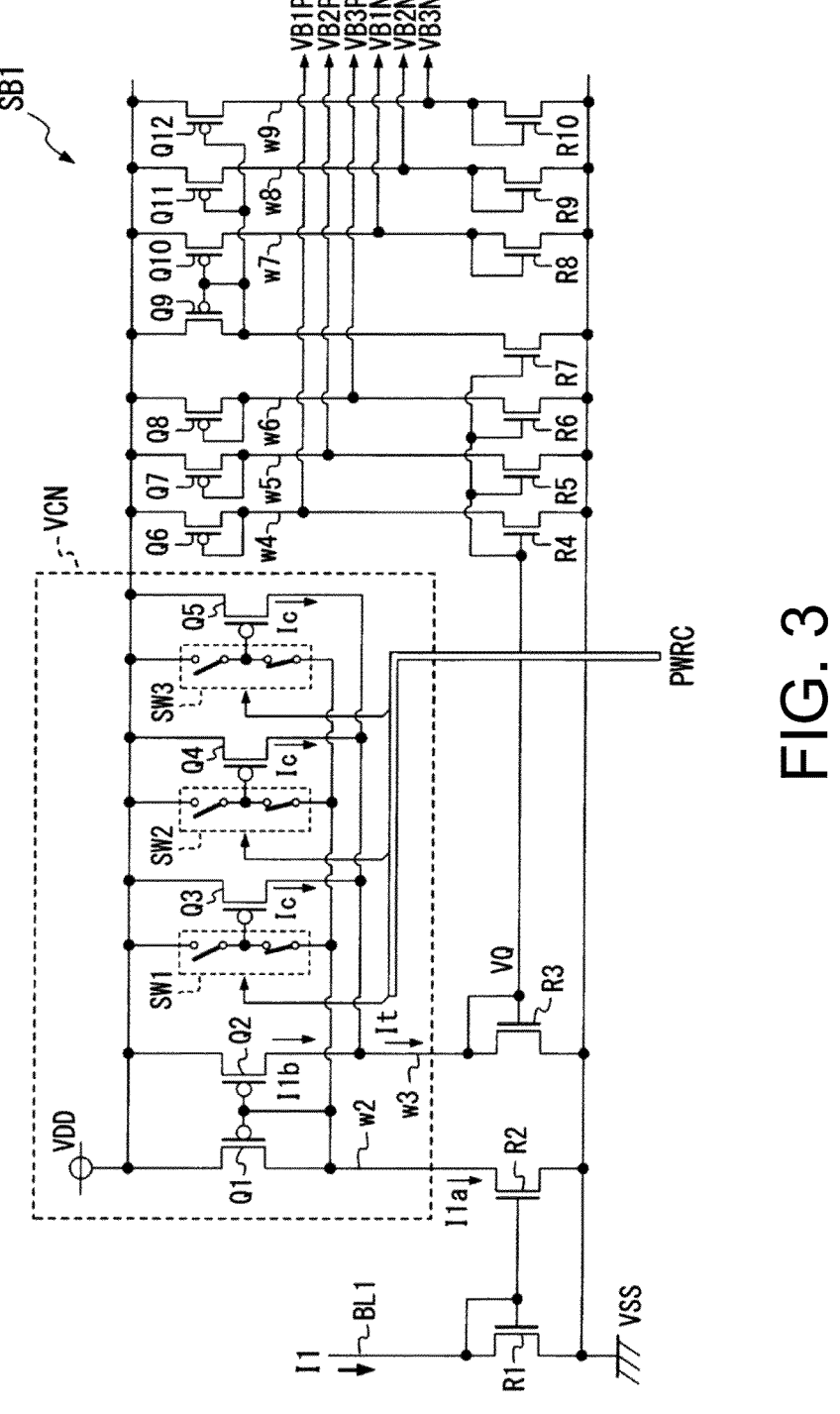
FIG. 3 is a circuit diagram showing the internal configuration of each of the sub-bias circuits SB1 to SB3.

FIG. 3 is a circuit diagram showing the internal configuration of the sub-bias circuit SB1, which is extracted from among the sub-bias circuits SB1 to SB3.

The sub-bias circuit SB1 includes a voltage adjustment unit VCN containing P-channel MOS type transistors Q1 to Q5 and switch circuits SW1 to SW3, P-channel MOS type transistors Q6 to Q12, and N-channel MOS type transistors R1 to R10.

The transistor R1 receives the bias control current I1 supplied from the main bias circuit MB_1 via the wiring BL1 at the drain thereof. The drain and the gate of the transistor R1 are connected to the gate of the transistor R2, and the ground voltage VSS is applied to the respective sources of the transistors R1 and R2. The drain of transistor R2 is connected to the voltage adjustment unit VCN via a node w2.

With the configuration, the transistor R2 generates a current I1a corresponding to the bias control current I1 and causes the current I1a to flow to the node w2.

The respective gates of the transistors Q1 and Q2 in the voltage adjustment unit VCN are connected to the node w2. The power supply voltage VDD is applied to the respective sources of the transistors Q1 and Q2. The drain of the transistor Q2 is connected to the drain and the gate of the transistor R3 via a node w3. The ground voltage VSS is applied to the source of the transistor R3.

With the configuration, the transistor Q2 generates a reference bias voltage VQ at the node w3 by sending a current I1b corresponding to the aforementioned current I1a to the node w3.

The power supply voltage VDD is applied to the respective sources of the transistors Q3 to Q5 in the voltage adjustment unit VCN, and the respective drains thereof are connected to the node w3.

The switch circuit SW1 is set, in response to the bias control signal PWRC, to a state (referred to as an OFF state) where the power supply voltage VDD is supplied to the gate of the transistor Q3, or to a state (referred to as an ON state) where the node w2 is connected to the gate of the transistor Q3. The switch circuit SW2 is set, in response to the bias control signal PWRC, to a state (referred to as an OFF state) where the power supply voltage VDD is supplied to the gate of the transistor Q4, or to a state (referred to as an ON state) where the node w2 is connected to the gate of the transistor Q4. The switch circuit SW3 is set, in response to the bias control signal PWRC, to a state (referred to as an OFF state) where the power supply voltage VDD is supplied to the gate of the transistor Q5, or to a state (referred to as an ON state) where it connects the node w2 is connected to the gate of the transistor Q5.

The transistor Q3 becomes an ON state merely when the switch circuit SW1 is in an ON state, and sends a current Ic corresponding to the aforementioned current I1a to the node w3. The transistor Q4 becomes an ON state merely when the switch circuit SW2 is in an ON state, and sends a current Ic corresponding to the aforementioned current I1a to the node w3. The transistor Q5 becomes an ON state merely when the switch circuit SW3 is in an ON state, and sends a current Ic corresponding to the aforementioned current I1a to the node w3.

With the aforementioned configuration, the voltage adjustment unit VCN sends a synthetic current It to the node w3, which is a combination of the current I1b corresponding to the bias control current I1 and the currents Ic sent from the transistors Q3 to Q5 that are set to an ON state in response to the bias control signal PWRC. The voltage value of the reference bias voltage VQ generated by sending the synthetic current It to the node w3 is adjusted.

For example, in the case where the voltage adjustment unit VCN receives the bias control signal PWRC indicating zero as the number of transistors to be set to an ON state among the transistors Q3 to Q5, the synthetic current It flowing to the node w3 becomes the current I1b.

Moreover, in the case where the voltage adjustment unit VCN receives the bias control signal PWRC indicating "2" as the number of transistors to be set to an ON state among the transistors Q3 to Q5, for example, merely Q3 and Q4 among the transistors Q3 to Q5 are set to an ON state. As a result, the synthetic current It becomes a current (I1b+2·Ic) which is the current I1b plus the currents Ic respectively sent from the transistors Q3 and Q4.

In other words, the voltage adjustment unit VCN shown in FIG. 3 adjusts the voltage value of the reference bias voltage VQ in four stages in response to the bias control signal PWRC.

In FIG. 3, the respective gates of the transistors R4 to R7 are connected to the gate of the aforementioned transistor R3 and the node w3, and the ground voltage VSS is applied to the respective sources of the transistors R4 to R7. The drain of the transistor R4 is connected to the gate and the drain of the transistor Q6 via a node w4. The drain of the transistor R5 is connected to the gate and the drain of the transistor Q7 via a node w5. The drain of the transistor R6 is connected to the gate and the drain of the transistor Q8 via a node w6. The power supply voltage VDD is applied to the respective sources of the transistors Q6 to Q8.

The drain of the transistor R7 is connected to the drain of the transistor Q9 and the respective gates of the transistors Q9 to Q12. The power supply voltage VDD is applied to the respective sources of the transistors Q9 to Q12. The drain of the transistor Q10 is connected to the gate and the drain of the transistor R8 via a node w7. The drain of the transistor Q11 is connected to the gate and the drain of the transistor R9 via a node w8. The drain of the transistor Q12 is connected to the gate and the drain of the transistor R9 via a node w9. The ground voltage VSS is applied to the respective sources of the transistors R8 to R10.

In the circuit consisting of the aforementioned transistors R4 and Q6, the transistor R4 causes a current corresponding to the reference bias voltage VQ supplied to the gate thereof to flow to the node w4. As a result, the voltage generated at the node w4 is supplied as the bias voltage VB1P to the amplifiers AP1 to APr.

In the circuit consisting of the transistors R5 and Q7, the transistor R5 causes a current corresponding to the reference bias voltage VQ supplied to the gate thereof to flow to the node w5. As a result, the voltage generated at the node w5 is supplied as the bias voltage VB2P to the amplifiers AP1 to APr.

In the circuit consisting of the transistors R6 and Q8, the transistor R6 causes a current corresponding to the reference bias voltage VQ supplied to the gate thereof to flow to the node w6. As a result, the voltage generated at the node w6 is supplied as the bias voltage VB3P to the amplifiers AP1 to APr.

Further, the transistor R7 causes a current corresponding to the reference bias voltage VQ supplied to the gate thereof to flow via the transistor Q9. Thus, the current corresponding to the reference bias voltage VQ is sent from the respective drains of the transistors Q10 to Q12 to the nodes w7 to w9, respectively.

At this time, the voltage generated at the node w7 as a result of the transistor Q10 sending a current corresponding to the reference bias voltage VQ to the node w7 is supplied as the bias voltage VB1N to the amplifiers AP1 to APr. Moreover, the voltage generated at the node w8 as a result of the transistor Q11 sending a current corresponding to the reference bias voltage VQ to the node w8 is supplied as the bias voltage VB2N to the amplifiers AP1 to APr. Furthermore, the voltage generated at the node w9 as a result of the transistor Q12 sending a current corresponding to the reference bias voltage VQ to the node w9 is supplied as the bias voltage VB3N to the amplifiers AP1 to APr.

In this manner, the sub-bias circuit SB1 generates the bias voltages VB1N to VB3N and VB1P to VB3P by applying current-to-voltage conversion processing to the bias control current I1. Furthermore, the sub-bias circuit SB1 adjusts the respective voltage values of the six systems of the bias voltages VB1N to VB3N and VB1P to VB3P in response to the bias control signal PWRC.

In addition, by adopting a configuration similar to the configuration shown in FIG. 3 in the sub-bias circuits SB2 and SB3, similar to the sub-bias circuit SB1, the sub-bias circuits SB2 and SB3 generate the bias voltages VB1N to VB3N and VB1P to VB3P based on the bias control currents I2 and I3 received by the sub-bias circuits SB2 and SB3, respectively, as well as adjusting the voltage values of the respective bias voltage based on the bias control signal PWRC.

Next, the internal operation of the output amplifier circuit 100_1 is described in detail.

Figure 4:
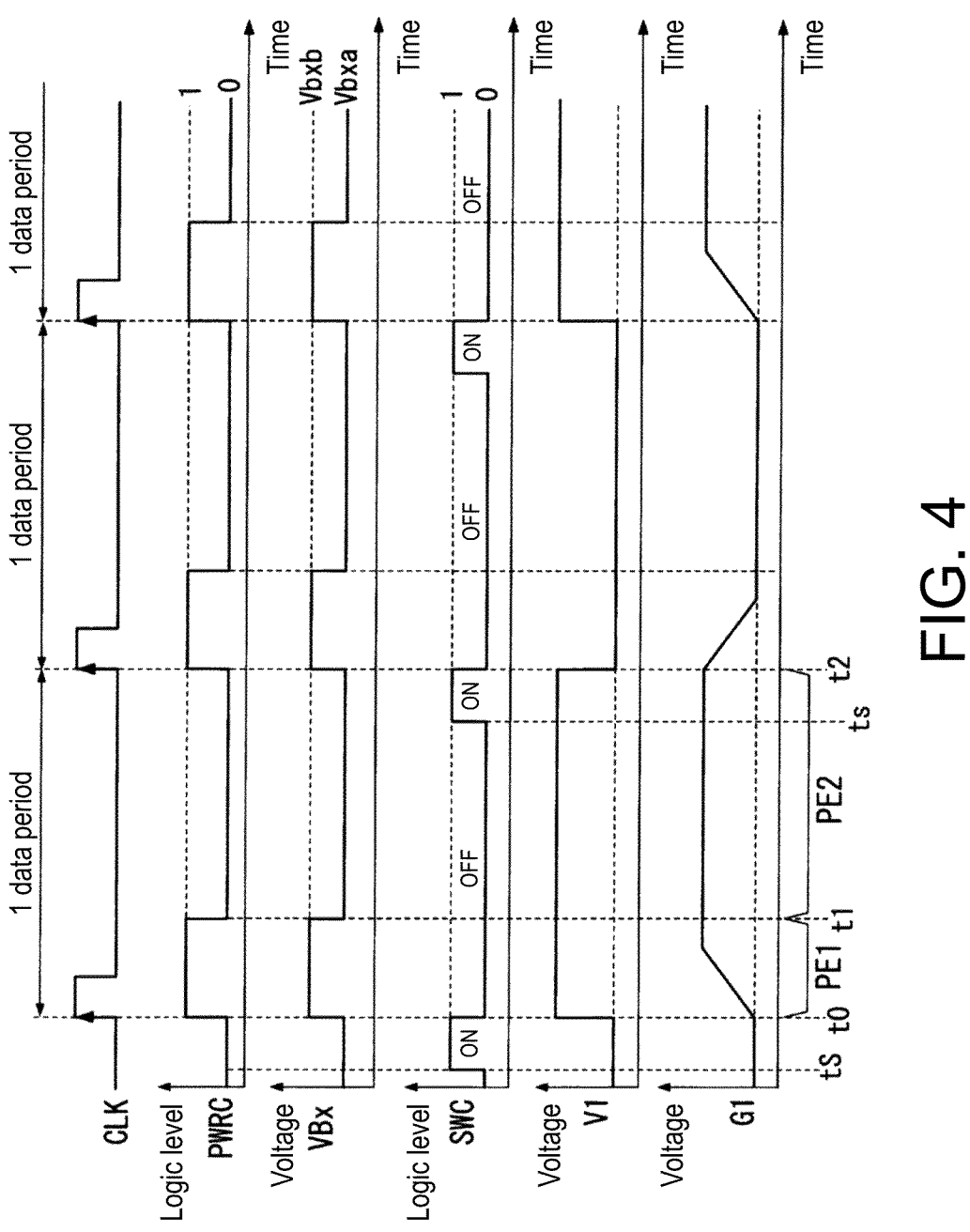
FIG. 4 is a time chart representing an example of the internal operation of the output amplifier circuit 100_1.

FIG. 4 is a time chart representing an example of the internal operation (CLK, PWRC, SWC, VBx, V1, and G1) of the output amplifier circuit 100_1. Further, in FIG. 4, VBx collectively represents the bias voltages VB1N to VB3N and VB1P to VB3P generated by each of the sub-bias circuits SB1 to SB3.

The control unit CN_1 generates a bias control signal PWRC with a logic level 1, which specifies a predetermined first voltage value for making the amplifier high slew rate as the voltage value of the bias voltage, for a predetermined first period PE1 from a time point t0 of the rising edge of the clock signal CLK, and supplies the bias control signal PWRC to the sub-bias circuits SB1 to SB3. Therefore, over the first period PE1 shown in FIG. 4, the sub-bias circuits SB1 to SB3 supply bias voltage groups VBx (VB1N to VB3N and VB1P to VB3P) having a high voltage value Vbxb to the amplifier groups belonging to the respective groups thereof, according to the bias control signal PWRC.

Then, for a second period PE2 from a time point t1 when the first period PE1 has elapsed to a time point t2 of the rising edge of the next clock signal CLK, the control unit CN_1 supplies a bias control signal PWRC with a logic level 0, which specifies a predetermined second voltage value for making the amplifier low slew rate as the voltage value of the bias voltage, to the sub-bias circuits SB1 to SB3. Therefore, over the second period PE2 shown in FIG. 4, the sub-bias circuits SB1 to SB3 supply bias voltage groups VBx (VB1N to VB3N and VB1P to VB3P) having a low voltage value Vbxa lower than the aforementioned high voltage value Vbxb to the amplifier groups belonging to the respective groups thereof, according to the bias control signal PWRC.

According to the series of operations described above, as shown in FIG. 4, for the first period PE1 from the time point t0 of the rising edge of the clock signal CLK, the operating current flowing in each of amplifiers AP is larger than the operating current flowing in each of the amplifiers AP during the second period PE2 subsequent to the first period PE1.

Thus, during the rising or falling interval of the output voltage (for example, the output voltage G1 shown in FIG. 4) in which high-speed response is required, the slew rate of the amplifier AP becomes high, so the rising or falling time of the output voltage output from the amplifier AP also becomes shorter.

On the other hand, during the second period PE2 from the end time point t1 of the first period PE1 to the time point t2 of the rising edge of the next clock signal CLK, the operating current flowing in each of the amplifiers AP becomes smaller than the operating current flowing in each of the amplifiers AP during the first period PE1.

Thus, during the constant voltage interval (PE2) of the output voltage in which high-speed response is not required, the power consumed by the amplifier AP is reduced.

In this manner, in the output amplifier circuit 100_1, by adjusting the bias voltage that determines the operating current within each of the amplifiers AP1 to APn according to the bias control signal PWRC, the slew rate of each of the amplifiers is controlled (changed) so both high-speed response and low power consumption may be achieved.

Furthermore, in the output amplifier circuit 100_1, as shown in FIG. 4, the control unit CN_1 sets the switch circuits SW12 and SW23 to an ON state for a predetermined period (ts to t2) during the latter half of the second period PE2 for each of data periods.

Thus, even when individually supplying the bias voltage groups (VB1N to VB3N and VB1P to VB3P) to each of the first to third groups in which the amplifiers AP1 to APn are divided into three groups, the voltage difference of bias voltages between the groups may be reduced. Therefore, even if variations occur in the voltage values of the bias voltage groups (VB1N to VB3N and VB1P to VB3P) among the sub-bias circuits SB1 to SB3, the difference in the voltage values thereof disappears immediately before the end of each of the data periods, so that display unevenness within the display screen is reduced.

Further, in the case of using the six switch elements included in each of the switch circuits SW12 and SW23 that have an ON resistance higher than a predetermined value, the control unit CN_1 may set the switch circuits SW12 and SW23 to an ON state throughout the first period PE1 and the second period PE2. Moreover, in this case, instead of the six switch elements included in each of the switch circuits SW12 and SW23, six high resistance elements may be adopted.

Figure 5:
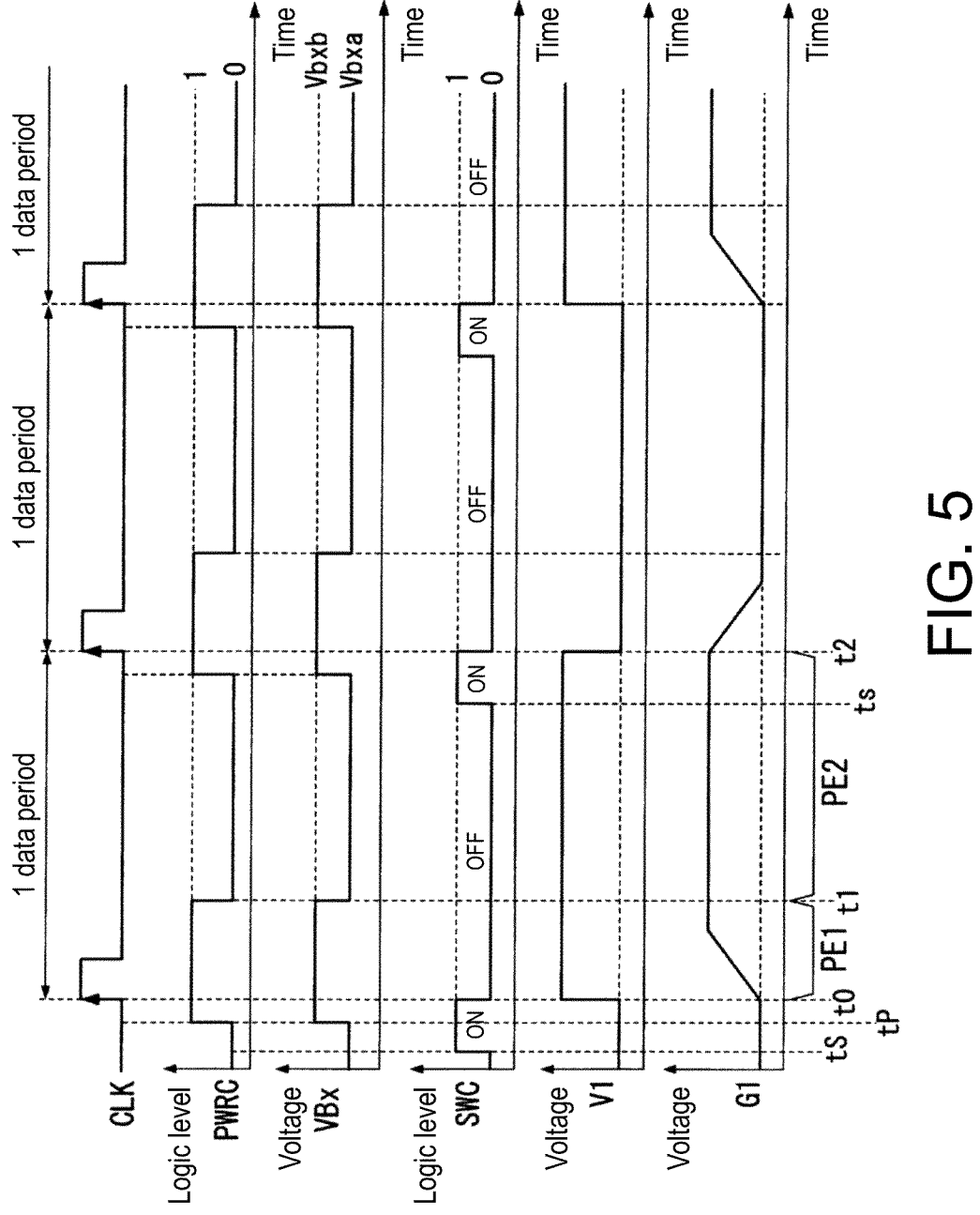
FIG. 5 is a time chart representing another example of the internal operation of the output amplifier circuit 100_1.

FIG. 5 is a time chart representing another example of the internal operation (CLK, PWRC, SWC, VBx, V1, and G1) of the output amplifier circuit 100_1.

In the operation shown in FIG. 5, for each of data periods, at a time point tP, which is a predetermined time before the starting time point t0 of the data period thereof, the control unit CN_1 switches the bias control signal PWRC from a logic level 0 state that causes the amplifier to have a low slew rate to a logic level 1 state that causes the amplifier to have a high slew rate. Further, the ON/OFF switching timing of the switch circuits SW12 and SW23 by the switch control signal SWC is the same as the timing shown in FIG. 4.

According to the operation shown in FIG. 5, even if the output voltage of each of the amplifiers fluctuates slightly due to the influence of external noise (for example, coupling noise associated with changes in the gate voltage) during the second period PE2 when the bias voltage is low, the output voltage may be restored to the desired voltage value.

In addition, for each of the data periods, since each of the amplifiers is set to a high slew rate state by the bias control signal PWRC from just before the start of the data period thereof, each of the amplifiers operates at a high slew rate without causing a delay in response to the change in the output voltage immediately after the start of one data period. Thus, the effect of response delay from the time the adjustment process to change the slew rate of the amplifier according to the bias control signal PWRC starts until the bias voltage actually changes may be eliminated.

Example 2

Figure 6:
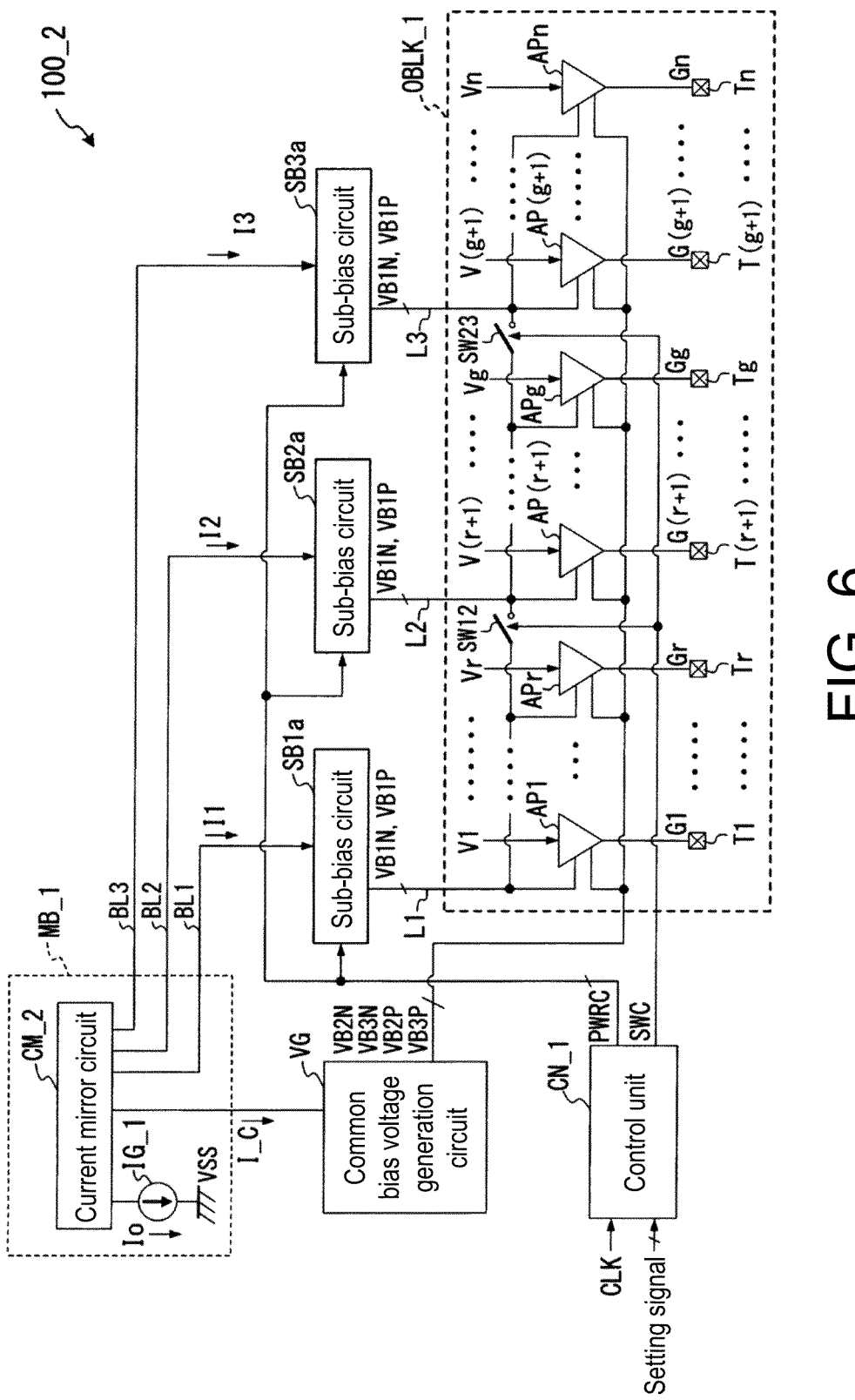
FIG. 6 is a block diagram showing the configuration of an output amplifier circuit 100_2 as a second example of the output amplifier circuit according to the disclosure.

FIG. 6 is a block diagram showing the configuration of an output amplifier circuit 100_2 as a second example of the output amplifier circuit according to the disclosure.

The output amplifier circuit 100_2 is the same as the output amplifier circuit shown in FIG. 1 in terms of other configurations (IG_1, CN_1, and OBLK_1), except for adopting sub-bias circuits SB1a to SB3a instead of sub-bias circuits SB1 to SB3, adopting a current mirror circuit CM_2 instead of the current mirror circuit CM_1, and being newly provided with a common bias voltage generation circuit VG.

The current mirror circuit CM_2 supplies a bias control current I1, which is a copy of a reference current Io generated by the reference current source IG_1, to the sub-bias circuit SB1a, supplies a bias control current I2, which is a copy of the reference current Io, to the sub-bias circuit SB2a, and supplies a bias control current I3, which is a copy of the reference current Io, to the sub-bias circuit SB3a.

Furthermore, the current mirror circuit CM_2 supplies a bias control current I_C, which is a copy of the reference current Io, to the common bias voltage generation circuit VG.

The common bias voltage generation circuit VG performs current-to-voltage conversion on the bias control current I_C to generate bias voltages VB2N, VB3N, VB2P, and VB3P that have little impact on the slew rate of the amplifiers, and supplies the voltages to all of the amplifiers AP1 to APn.

The sub-bias circuit SB1a performs current-to-voltage conversion on the bias control current I1 to generate bias voltages VB1N and VB1P that have a significant impact on the slew rate of the amplifiers, and supplies the voltages to the amplifiers AP1 to APr belonging to the first group.

The sub-bias circuit SB2a performs current-to-voltage conversion on the bias control current I2 to generate bias voltages VB1N and VB1P that have a significant impact on the slew rate of the amplifiers, and supplies thee voltages to the amplifiers AP(r+1) to APg belonging to the second group.

The sub-bias circuit SB3a performs current-to-voltage conversion on the bias control current I3 to generate bias voltages VB1N and VB1P that have a significant impact on the slew rate of the amplifiers, and supplies the voltages to the amplifiers AP(g+1) to APn belonging to the third group.

In this manner, in the output amplifier circuit 100_2, among the six systems of bias voltage groups, the bias voltages VB1N and VB1P, which have a significant impact on the slew rate of the amplifiers, are generated by each of the sub-bias circuits SB1a to SB3a, and other bias voltage groups (VB2N, VB3N, VB2P, and VB3P) are generated by the common bias voltage generation circuit VG as common for all of the amplifiers.

Therefore, each of the sub-bias circuits SB1a to SB3a has a configuration that omits the transistor groups involved in generating the bias voltages VB2N, VB3N, VB2P, and VB3P from the configuration shown in FIG. 3. Thus, the number of elements constituting the sub-bias circuits may be reduced and a reduction in area may be achieved.

Example 3

Figure 7:
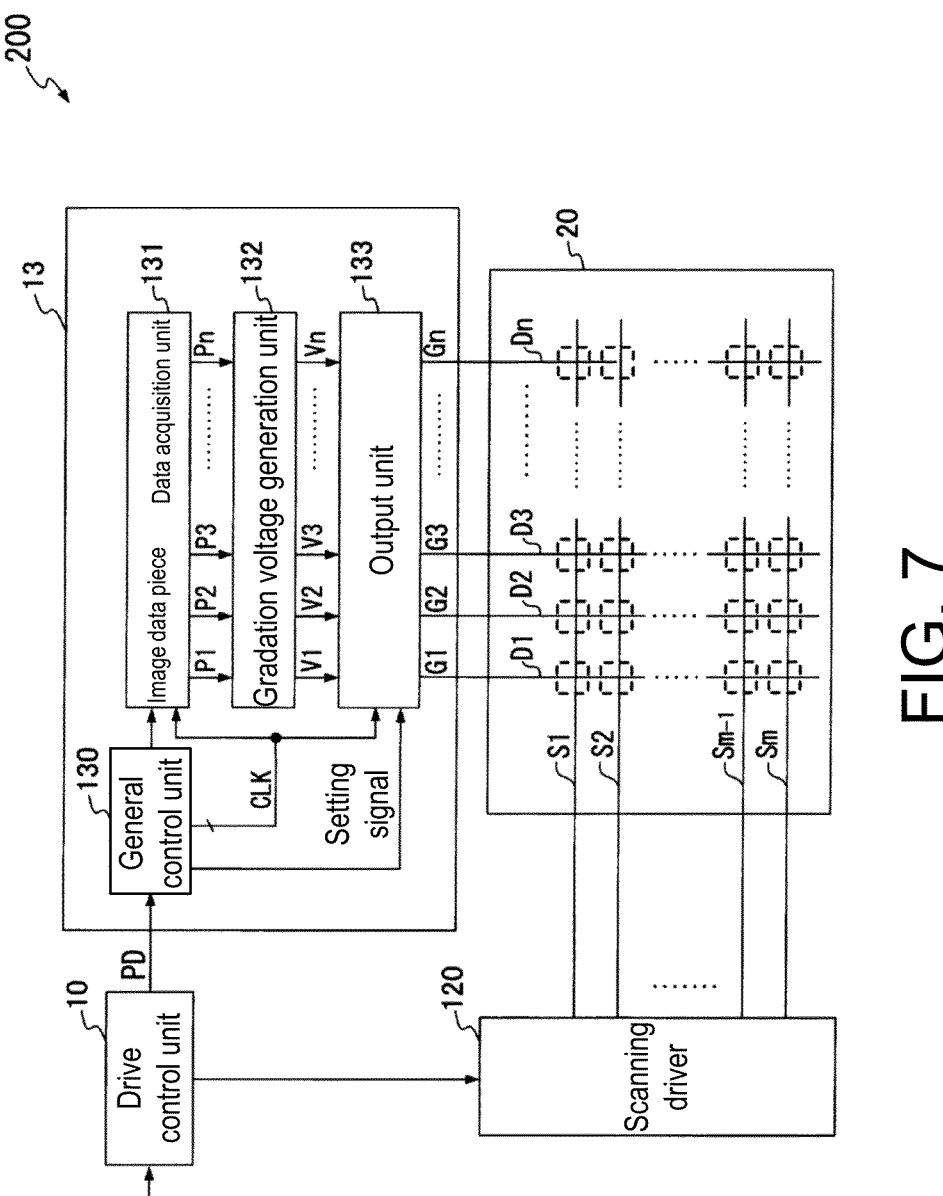
FIG. 7 is a block diagram showing the configuration of a display device having a display driver that includes the output amplifier circuit 100_1 or 100_2.

FIG. 7 is a block diagram showing the configuration of a display device 200 having a display driver that includes an output amplifier circuit according to the disclosure.

As shown in FIG. 7, the display device 200 includes a drive control unit 10, a scanning driver 120, a data driver 13, and a display panel 20.

The display panel 20 consists of, for example, an organic EL panel or a liquid crystal display panel. The display panel 20 is formed with horizontal scanning lines S1 to Sm (where m is an integer of 2 or more) extending in the horizontal direction of the two-dimensional screen and data lines D1 to Dn (where n is an integer of 2 or more) extending in the vertical direction of the two-dimensional screen. Display cells are formed in each of intersection areas (areas enclosed by dotted lines) of the horizontal scanning lines and the data lines.

Further, the horizontal scanning lines S1 to Sm are connected to the scanning driver 120, and the data lines D1 to Dn are connected to the data driver 13.

The drive control unit 10 receives a video signal VD, detects a horizontal synchronization signal from the video signal VD, and supplies the horizontal synchronization signal to the scanning driver 120. In addition, the drive control unit 10 generates an image data signal PD that includes a sequence of pixel data pieces representing the brightness level of pixels in, for example, 8-bit brightness gradation based on the video signal VD, along with various control signals such as a clock signal and a data acquisition signal, and supplies the image data signal PD to the data driver 13.

The scanning driver 120 sequentially applies a horizontal scanning pulse to each of the horizontal scanning lines S1 to Sm of the display panel 20 with a timing signal synchronized with the horizontal synchronization signal supplied from the drive control unit 10.

The data driver 13 is formed, for example, on a semiconductor integrated circuit (IC) chip and includes a data acquisition unit 131, a gradation voltage generation unit 132, and an output unit 133.

The data acquisition unit 131 acquires pixel data pieces for one horizontal scanning line at a time, that is, n pieces at a time, in response to the data acquisition signal included in the image data signal PD. The data acquisition unit 131 designates the acquired n pixel data pieces as pixel data P1 to Pn, and supplies the pixel data P1 to Pn to the gradation voltage generation unit 132 at the timing of, for example, the rising edge of the clock signal CLK. Further, the clock signal CLK is generated within the data driver 13 based on the clock signal included in the image data signal PD.

The gradation voltage generation unit 132 converts the pixel data P1 to Pn supplied from the data acquisition unit 131 into gradation voltages V1 to Vn having voltage values corresponding to the respective brightness levels thereof, and supplies the gradation voltages V1 to Vn to the output unit 133.

The output unit 133 includes the aforementioned output amplifier circuit 100_1 or 100_2, receives the gradation voltages V1 to Vn as input voltages V1 to Vn, individually amplifies the respective input voltages V1 to Vn with the amplifiers AP1 to APn to obtain output voltages G1 to Gn, and supplies the output voltages G1 to Gn to the data lines D1 to Dn of the display panel 20.

Further, in the aforementioned example, the output amplifier circuit 100_1 or 100_2 is used as the output unit 133 of the data driver 13, but the output amplifier circuit may also be used as a circuit for outputting the aforementioned timing signal included in the drive control unit 10.

In addition, in the output amplifier circuit 100_1 or 100_2 shown in FIG. 1 or FIG. 6, three sub-bias circuits (SB1 to SB3, or SB1a to SB3a) are provided for one main bias circuit MB_1, but the number of sub-bias circuits may be two or more. Furthermore, the main bias circuit MB_1 may be eliminated, and a current mirror circuit for generating a bias control current that is a copy of the reference current Io may be provided in each of sub-bias circuits.

Furthermore, in the output amplifier circuit 100_1 or 100_2 shown in FIG. 1 or FIG. 6, each of the sub-bias circuits generates six bias voltages (VB1N to VB3N and VB1P to VB3P), but each of the sub-bias circuits may generate at least one bias voltage.

In short, the output amplifier circuit according to the disclosure may include the following: first to nth (where n is an integer of 2 or more) amplifiers, first to Kth (where K is an integer of 2 or more) bias circuits, first to Kth wirings, and a switch circuit.

The first to nth amplifiers (AP1 to APn) receive first to nth input voltages (V1 to Vn) for each of data periods of a predetermined cycle, and generate first to nth output voltages (G1 to Gn) by amplifying the respective first to nth input voltages (V1 to Vn). The first to Kth bias circuits (for example, SB1 to SB3) are provided corresponding to each of the first to Kth amplifier groups, which are formed by grouping the first to nth amplifiers into K (for example, 3) groups. Each of the bias circuit generates a bias voltage for setting the current value of the operating current of the amplifiers. The first to Kth wirings (for example, L1 to L3) are mutually independent wirings that supply the bias voltages generated in the respective first to Kth bias circuits to the first to Kth amplifier groups, respectively. The switch circuit (SW12 or SW23), when in an ON state, connects one wiring among the first to Kth wirings with another wiring different from the one wiring.

What is claimed is:

1. An output amplifier circuit, comprising:

first to nth amplifiers, receiving first to nth (where n is an integer of 2 or more) input voltages for each of data periods of a predetermined cycle, and generating first to nth output voltages by amplifying the respective first to nth input voltages;

first to Kth bias circuits, provided corresponding to each of first to Kth amplifier groups formed by grouping the first to nth amplifiers into K (where K is an integer of 2 or more) groups, and each generating a bias voltage for setting a current value of an operating current of the amplifiers;

first to Kth wirings which are independent of one another, supplying the bias voltage generated by each of the first to Kth bias circuits to the first to Kth amplifier groups respectively;

a switch circuit, when in an ON state, connecting one wiring among the first to Kth wirings with another wiring among the first to Kth wirings that is different from the one wiring; and a control unit configured to set the switch circuit to an ON state or an OFF state, wherein, for each of the data periods comprising a first period immediately after a start of the data period and a second period subsequent to the first period, the control unit is configured to:

set the switch circuit to an OFF state during the first period, thereby disconnecting a connection between the one wiring and the another wiring; and set the switch circuit to an ON state at least throughout the second period.

2. The output amplifier circuit according to claim 1, wherein the switch circuit has an ON resistance higher than a predetermined value.

3. The output amplifier circuit according to claim 2, wherein the first to Kth bias circuits comprise a voltage adjustment unit which receives a bias control signal specifying a voltage value of the bias voltage, and adjusts the voltage value of each of the bias voltages to the voltage value specified by the bias control signal.

4. The output amplifier circuit according to claim 1, wherein the data period is set such that a start timing of the data period is shifted for each of a predetermined number of the first to nth amplifiers.

5. The output amplifier circuit according to claim 4, wherein the first to Kth bias circuits comprise a voltage adjustment unit which receives a bias control signal specifying a voltage value of the bias voltage, and adjusts the voltage value of each of the bias voltages to the voltage value specified by the bias control signal.

6. The output amplifier circuit according to claim 1, wherein the first to Kth bias circuits comprise a voltage adjustment unit which receives a bias control signal specifying a voltage value of the bias voltage, and adjusts the voltage value of each of the bias voltages to the voltage value specified by the bias control signal.

7. The output amplifier circuit according to claim 6, comprising a common bias voltage generation circuit which generates a bias voltage with a fixed voltage value different from the bias voltage and supplies the bias voltage to the first to nth amplifiers.

8. A display driver, comprising:

a gradation voltage generation circuit, generating first to nth (where n is an integer of 2 or more) gradation voltages each having a voltage value corresponding to a brightness level of each of pixels based on a video signal;

first to nth amplifiers, receiving the first to nth gradation voltages, and supplying first to nth output voltages by amplifying the respective first to nth gradation voltages to first to nth data lines of a display panel;

first to Kth bias circuits, provided corresponding to each of first to Kth amplifier groups formed by grouping the first to nth amplifiers into K (where K is an integer of 2 or more) groups, and each generating a bias voltage for setting a current value of an operating current of the amplifiers;

first to Kth wirings which are independent of one another, supplying the bias voltage generated by each of the first to Kth bias circuits to the first to Kth amplifier groups respectively;

a switch circuit, when in an ON state, connecting one wiring among the first to Kth wirings with another wiring among the first to Kth wirings that is different from the one wiring; and a control unit configured to set the switch circuit to an ON state or an OFF state, wherein, for each of the data periods comprising a first period immediately after a start of the data period and a second period subsequent to the first period, the control unit is configured to:

set the switch circuit to an OFF state during the first period, thereby disconnecting a connection between the one wiring and the another wiring; and set the switch circuit to an ON state at least throughout the second period.

9. A display device, comprising:

a display panel, comprising first to nth (where n is an integer of 2 or more) data lines extending along a horizontal direction of a display screen;

a gradation voltage generation circuit, generating first to nth gradation voltages each having a voltage value corresponding to a brightness level of each of pixels based on a video signal;

first to nth amplifiers, receiving the first to nth gradation voltages, and supplying first to nth output voltages by amplifying the respective first to nth gradation voltages to the first to nth data lines of the display panel;

first to Kth bias circuits, provided corresponding to each of first to Kth amplifier groups formed by grouping the first to nth amplifiers into K (where K is an integer of 2 or more) groups, and each generating a bias voltage for setting a current value of an operating current of the amplifiers;

first to Kth wirings which are independent of one another, supplying the bias voltage generated by each of the first to Kth bias circuits to the first to Kth amplifier groups respectively;

a switch circuit, when in an ON state, connecting one wiring among the first to Kth wirings with another wiring among the first to Kth wirings that is different from the one wiring; and a control unit configured to set the switch circuit to an ON state or an OFF state, wherein, for each of the data periods comprising a first period immediately after a start of the data period and a second period subsequent to the first period, the control unit is configured to:

set the switch circuit to an OFF state during the first period, thereby disconnecting a connection between the one wiring and the another wiring; and set the switch circuit to an ON state at least throughout the second period.

* * * * *